Figure 1:
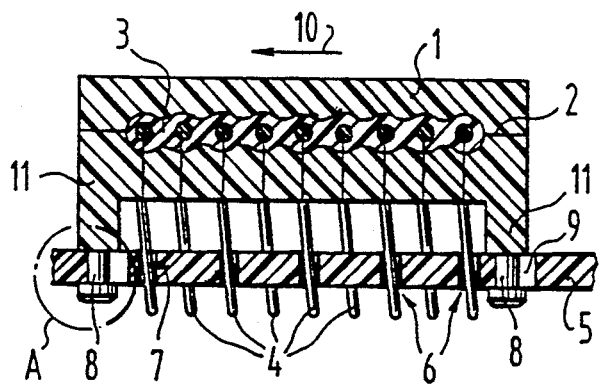

United States Patent [19]

Hildebrandt et al.

[11] Patent Number: 5,217,383
[45] Date of Patent: Jun. 8, 1993

[54] PLUG CONTACT ARRANGEMENT

[75] Inventors: Egon Hildebrandt, Salzkotten; Achim Walz, Schlob-Holte-Stukenbrock, both of Fed. Rep. of Germany

[73] Assignee: Siemens Nixdorf Informationssysteme AG, Paderborn, Fed. Rep. of Germany

[21] Appl. No.: 752,544

[22] PCT Filed: Mar. 21, 1990

[86] PCT No.: PCT/EP90/00467
§ 371 Date: Oct. 7, 1991
§ 102(e) Date: Oct. 7, 1991

[87] PCT Pub. No.: WO90/11630
PCT Pub. Date: Oct. 4, 1990

[30] Foreign Application Priority Data

Mar. 21, 1989 [DE] Fed. Rep. of Germany ....... 3909284

[51] Int. Cl.⁵ .............................. H01R 13/15
[52] U.S. Cl. ........................ 439/259; 439/75
[58] Field of Search ............ 439/259, 261–266, 439/268–270, 75, 342, 343

[56] References Cited

U.S. PATENT DOCUMENTS

| | | |
|---|---|---|
| 2,982,883 | 5/1961 | Gordy . |
| 3,964,813 | 6/1976 | Pizzeck . |
| 4,062,617 | 12/1977 | Johnson .............................. 439/342 |
| 4,540,229 | 9/1985 | Madden . |
| 4,887,974 | 12/1989 | Ichimura et al. ............... 439/342 X |

FOREIGN PATENT DOCUMENTS

| | | |
|---|---|---|
| 0117076 | 5/1990 | Japan ................................... 439/342 |
| 562025 | 7/1977 | U.S.S.R. ............................. 439/259 |
| 2136639 | 9/1984 | United Kingdom ............... 439/259 |

Primary Examiner—Steven C. Bishop
Assistant Examiner—Khiem Nguyen

[57] ABSTRACT

A contact arrangement for establishing electrical contact between the plug prongs (4) of an electrical component (1) and contact bores in another electrical component (5). To permit the force-free insertion of the plug prongs (4) into the associated contact bores (6) the free width of the contact bore (6) is greater than the external dimensions of the associated plug prongs (4). To establish contact, the two components (1) and (5) are displaced relative to one another essentially perpendicularly to the direction of the plug prongs (4) and are held in the displaced position. The plug prongs (4) are deflected laterally and clamped between the upper and lower inner edges of the contact bores (6).

12 Claims, 12 Drawing Sheets

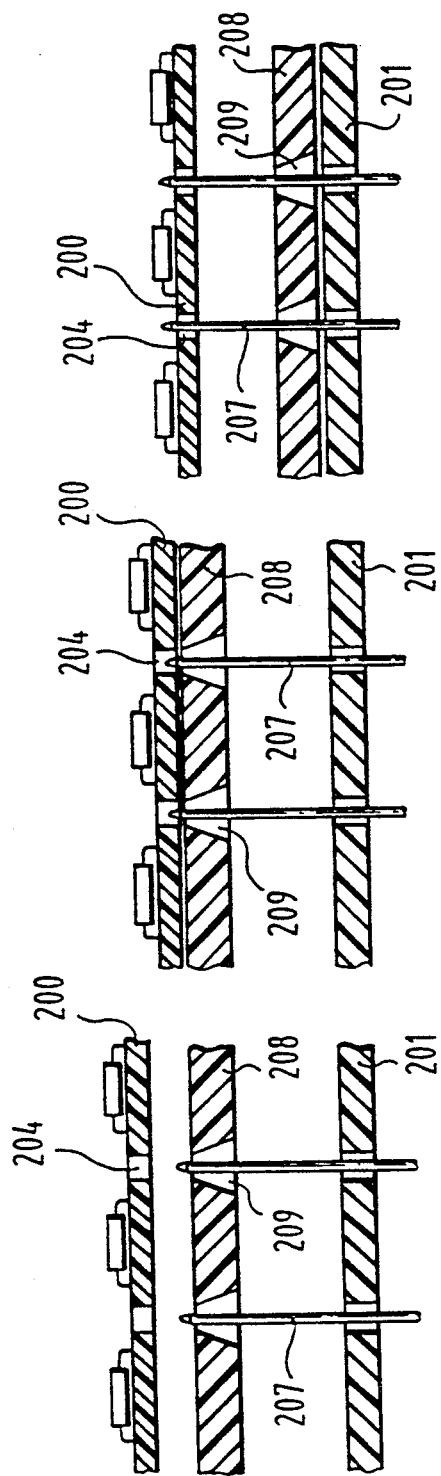

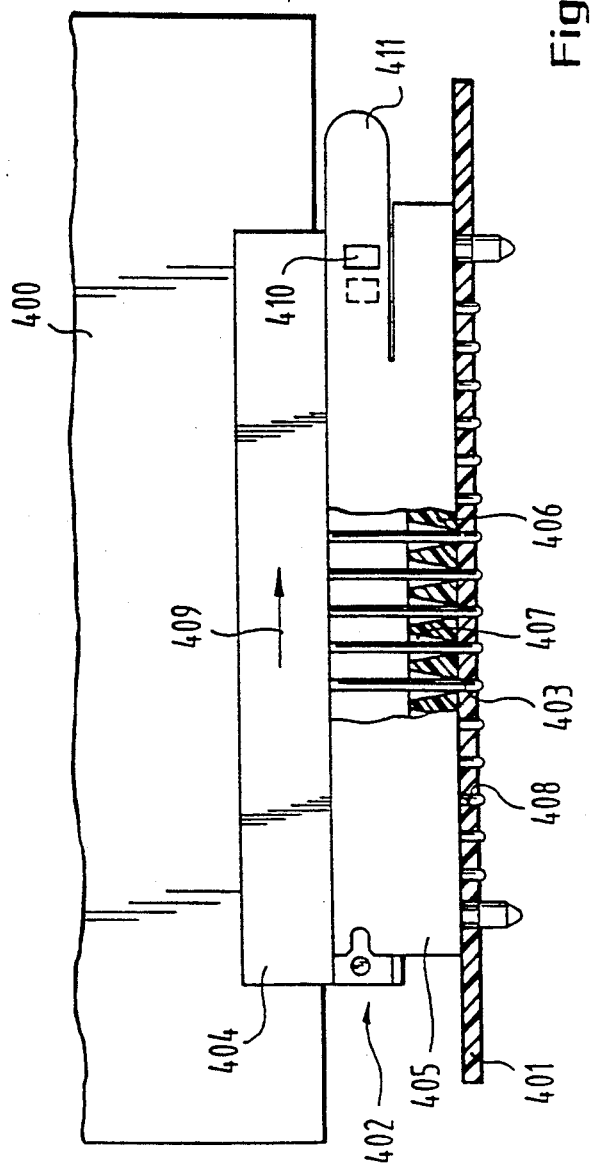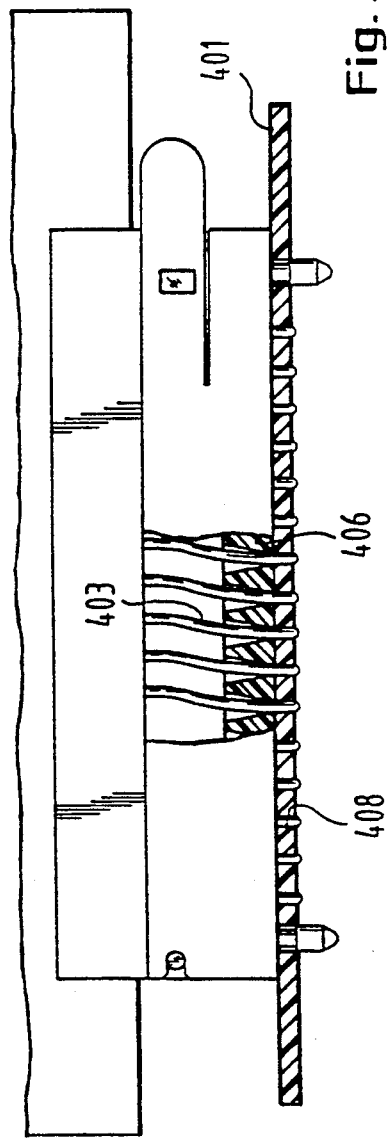

PLUG CONTACT ARRANGEMENT

The invention concerns a plug contact arrangement for electrically connecting the plug prongs of a first electrical component with contact bores formed in a second electrical component and wherein the plug prongs are shifted perpendicularly to their longitudinal directions and thereby tilted in the associated contact bores to make secure electrical contacts.

In modern electronic devices the problem often exists of making electrical contact between components having plug prongs and other components having contact bores for receiving the plug prongs. To assure a good contact the contact prongs are generally soldered into the contact bores. This process is very tedious and expensive. Moreover it has the disadvantage that the connected components cannot be separated and exchanged without destroying the solder connections. To facilitate an exchange of connected components it is already customary to stick sockets onto the contact bore containing component whose feet are soldered to the contact bores. The sockets have plug bushings into which the contact prongs of the plug component are inserted. To assure a good contact in this case the plug bushings generally have contact surfaces which are biased with spring force against the plug prongs. Because of this, particularly in the case of components having many plug prongs, large forces have to be used in coupling and uncoupling the components which often leads to damage of the components.

Another area of application in which customary contact arrangements are not satisfactory is the field of test adapters for testing circuit boards. The circuit boards to be checked generally have a very high density of circuit paths and circuit elements so that the number of test points is very large. Therefore, the test adapter must use an adapter plate with test pins suiting the test points of the circuit board, which test pins in turn are connected with the test circuit. In accordance with the customary WRAP-technique a cable is soldered to the lower ends of the test pins which cable leads to the test circuit. The preparation of such a test adapter is most tedious and leads, because of the uncertainties presented by the large number of cables to be handled by hand, to still further errors which are difficult to recognize and to remove.

A further area of application in which customary contact arrangements no longer provide satisfactory results is that of making contact between several circuit boards arranged parallel to one another. This occurs generally with regard to so-called wiring rear walls into which these circuit boards are plugged and which contain the connecting circuits for connecting the circuit boards.

The object of the present invention is to provide a contact arrangement of the type wherein the plug prongs of one component are shifted perpendicularly to their longitudinal directions and are thereby tilted in the contact bores of a second component to make secure electrical contacts which contact arrangement is simple, assures good contact and which is also easily disconnectable.

The contact arrangements of the invention are so-called zero force plug connectors since the contact bores have clear widths which are larger than the external measurements of the plug prongs or contact wires to be received in the bores. Therefore, the plug prongs or contact wires can be inserted into the contact bores without the expenditure of any force. Only after the insertion step are the plug prongs or the contact wires clamped into the contact bores by a tilting of the plug prongs or the contact wires, so that on one hand a secure hold and on the other hand a secure contact of the plug prongs or contact wires is provided with the associated contact bores. To release the contact arrangement the contact bores are again so arranged that no deflection of the plug prongs or contact wires transversely to their longitudinal direction is present so that the contact arrangement can be released with zero force.

Figure 2:
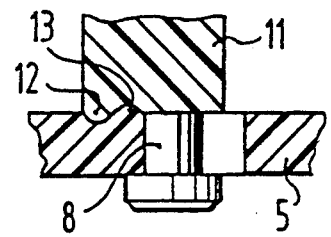
Figure 3:
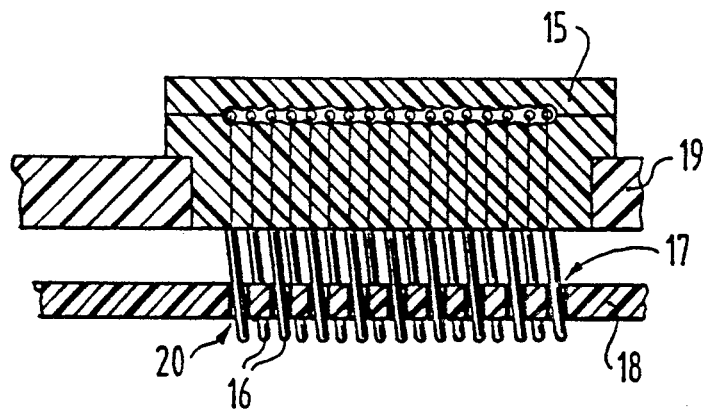
Figure 4:
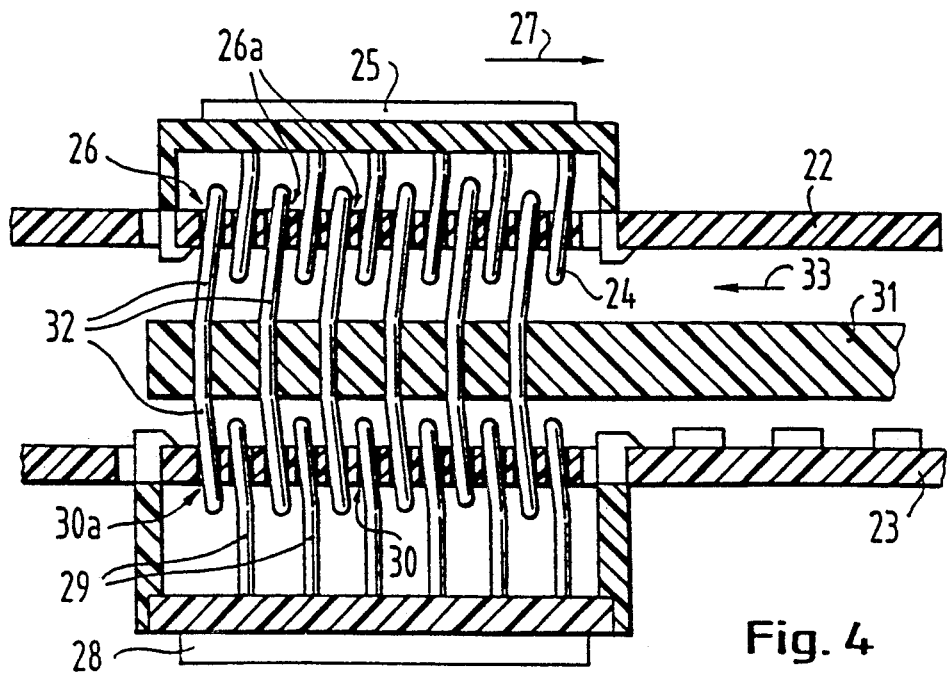
Figure 5:
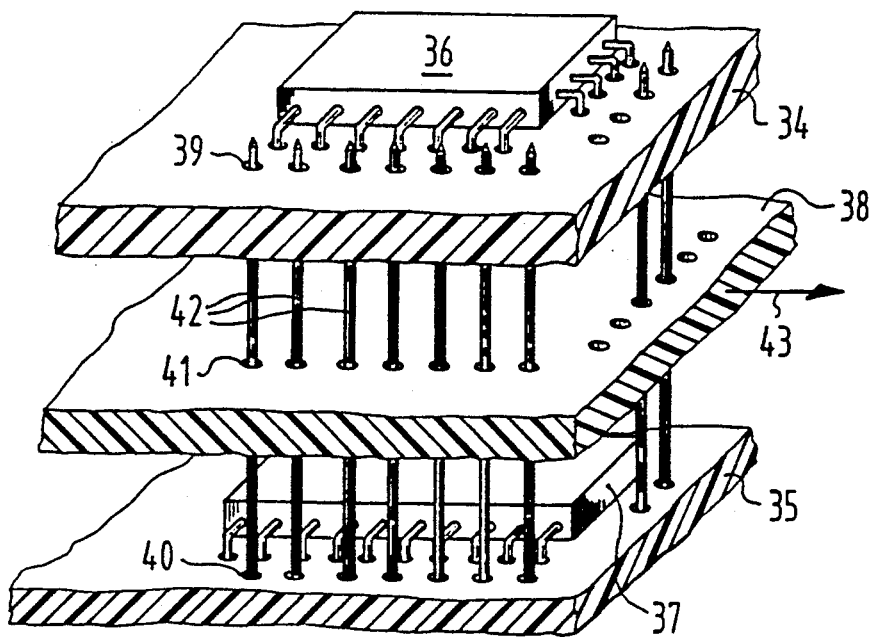
Figure 6:
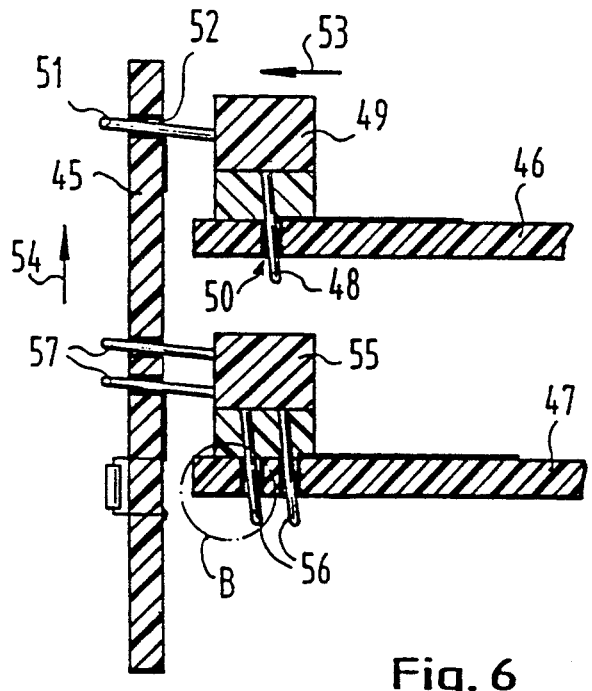
Figure 7:
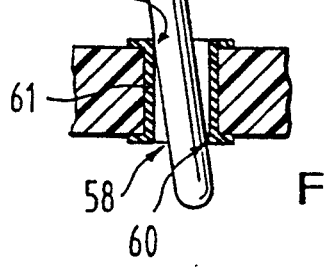
Figure 8:
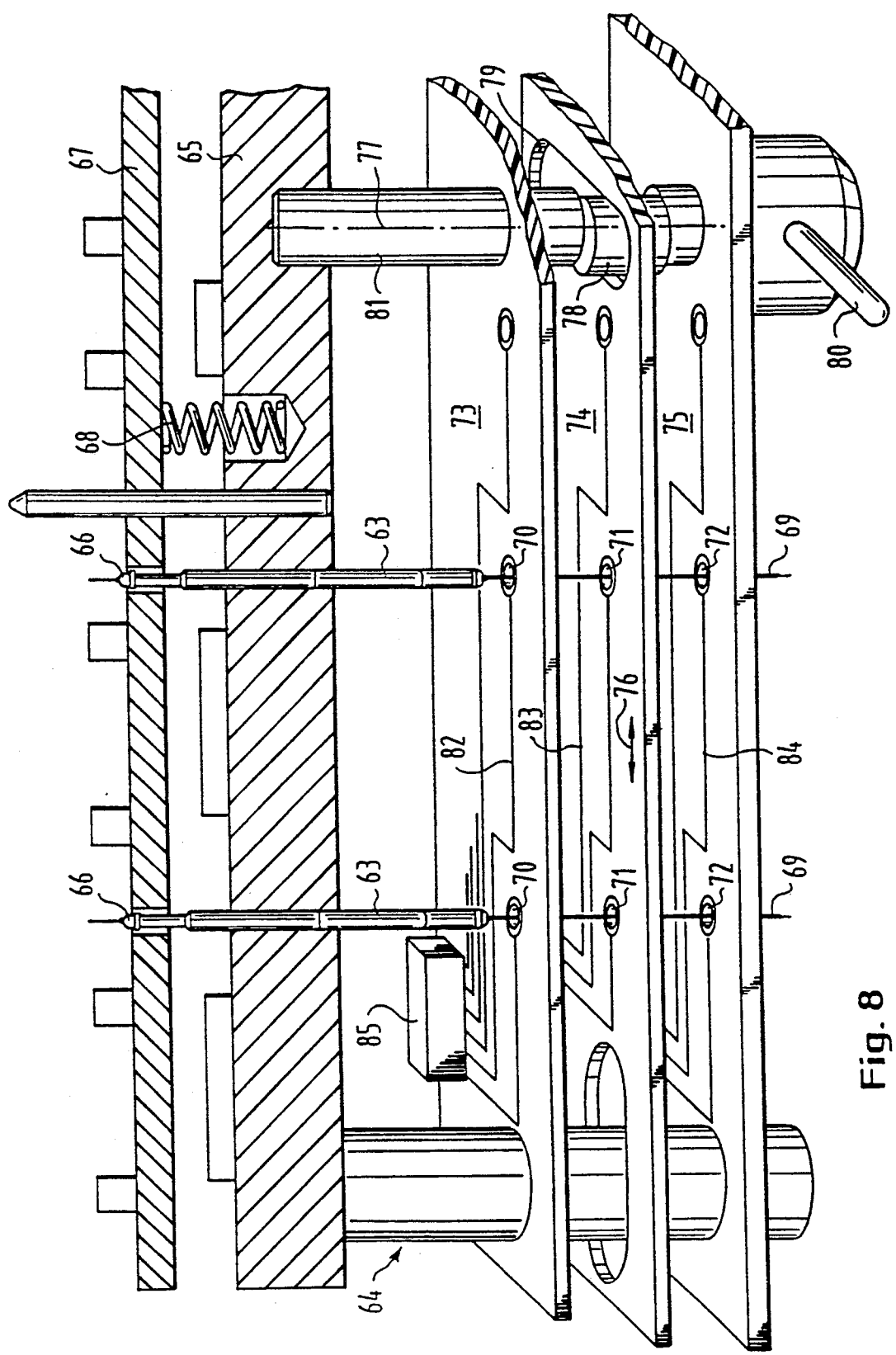
Figure 9:
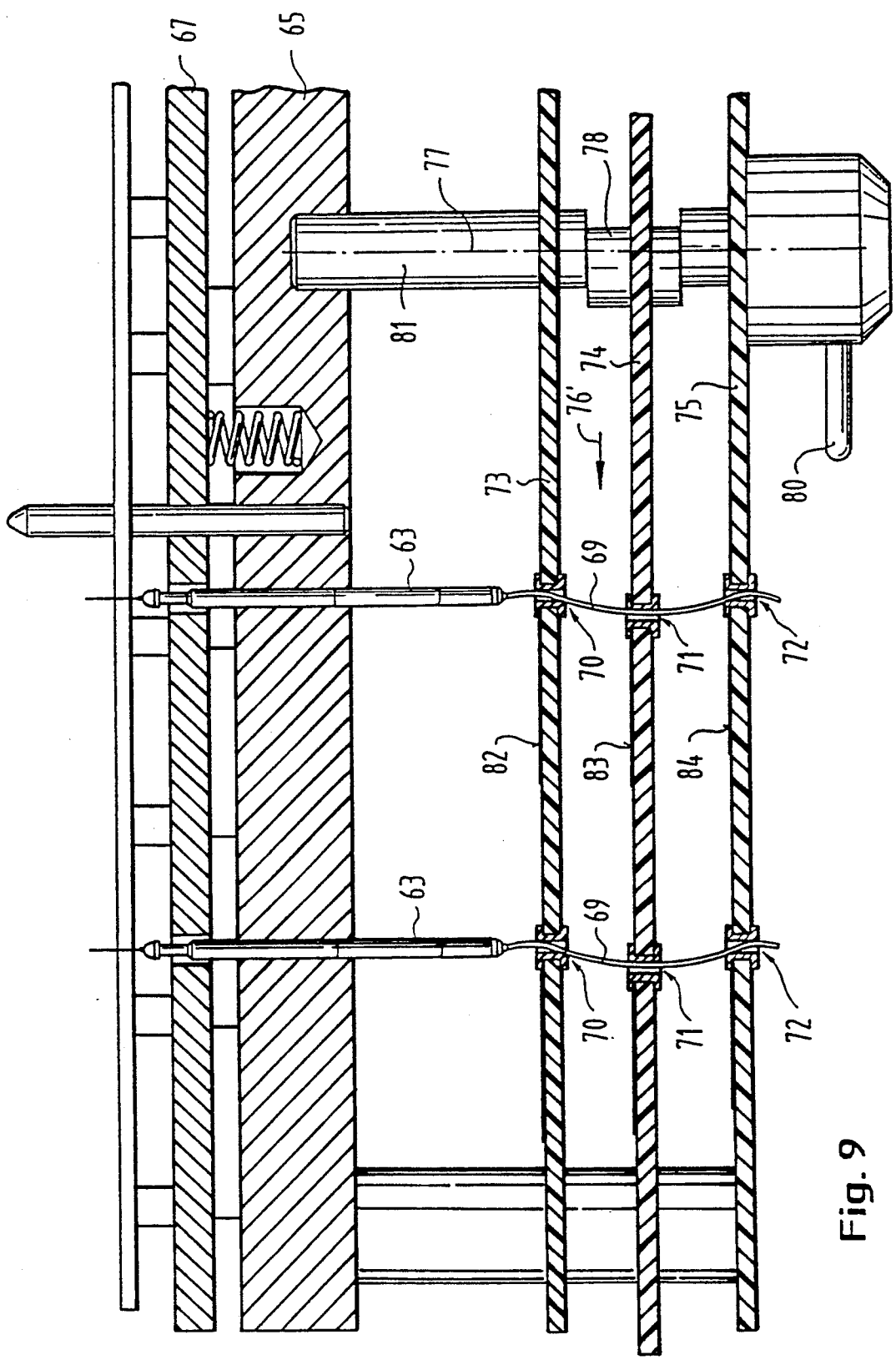
Figure 12:
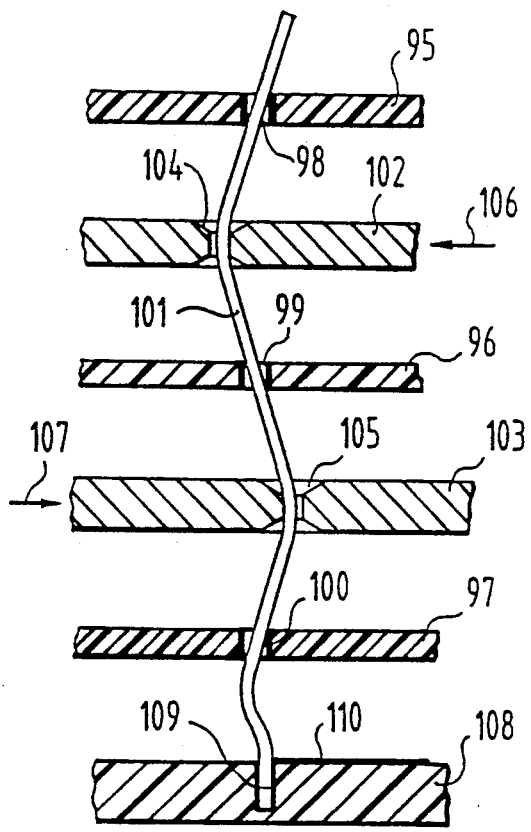
Figure 13:
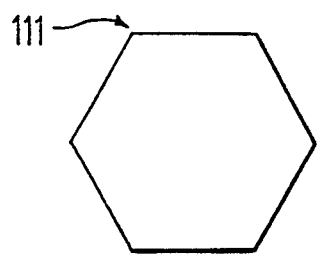
Figure 14:
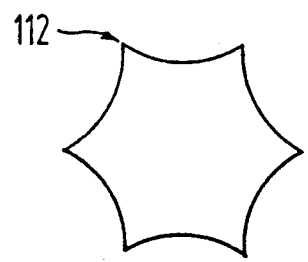
Figure 10:
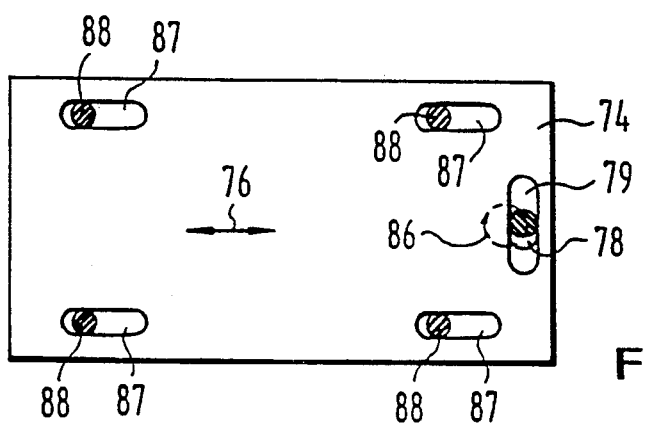
Figure 11:
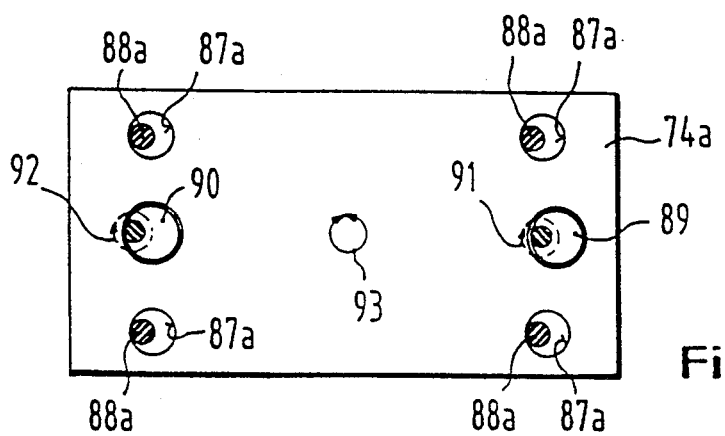
Figure 15:
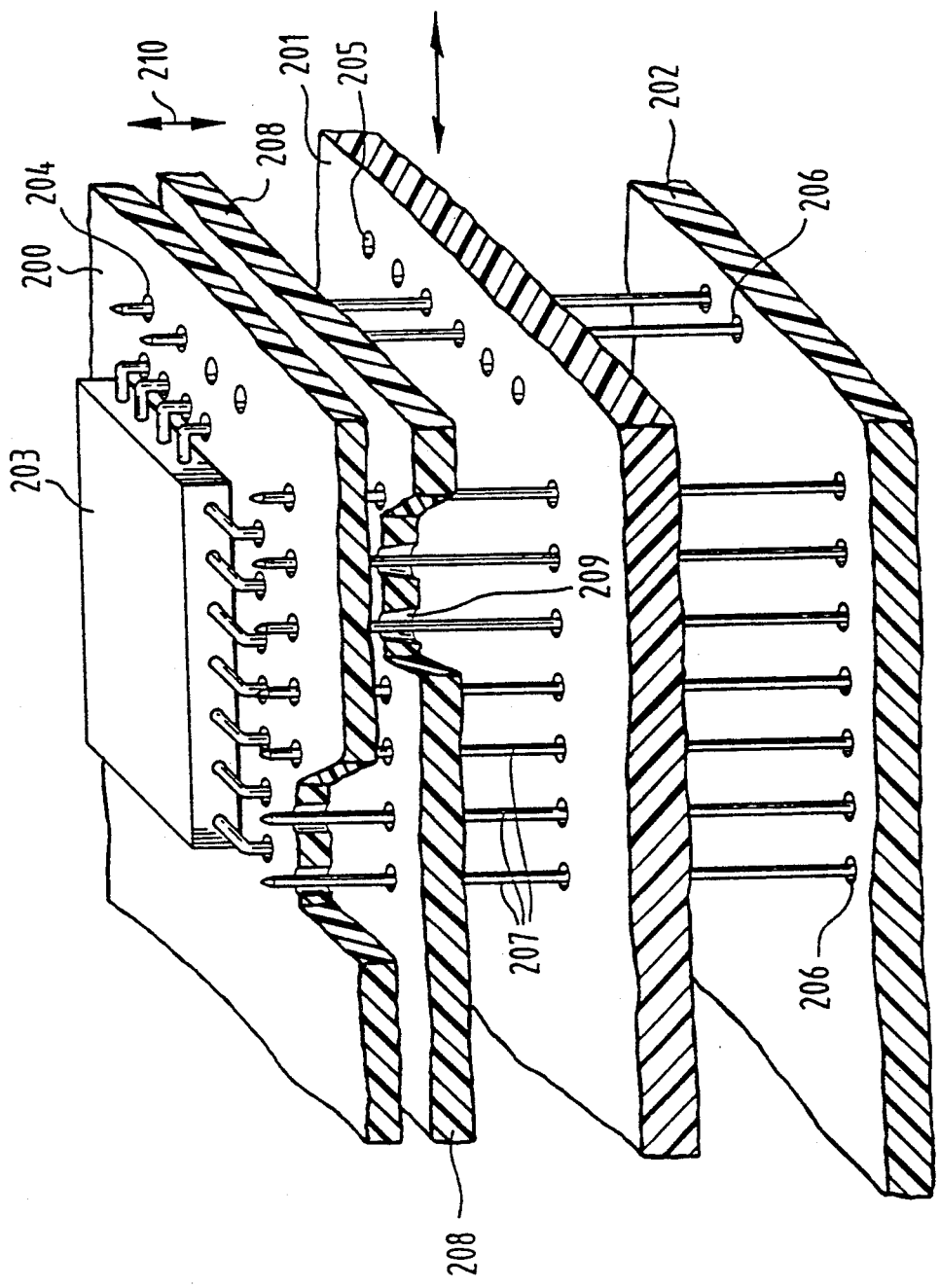

Further features and advantages of the invention are apparent from the patent claims, from the drawings illustrating exemplary embodiments of the invention and from the descriptions associated with the drawings. The drawings are:

FIG. 1—A schematic view of a flat cable plug provided with plug prongs connected to a circuit board;

FIG. 2—A view showing detail A of FIG. 1;

FIG. 3—A schematic view of another embodiment of a flat cable plug provided with plug prongs connected to a circuit board;

FIG. 4—A view showing two circuit boards each of which is connected to an electrical component provided with plug prongs as well as a device for connecting the two circuit boards to one another;

FIG. 5-A perspective view of an arrangement somewhat according to FIG. 4 with a device different from that of FIG. 4 for connecting the two circuit boards to one another;

FIG. 6—A schematic view of a contact arrangement for connecting two circuit boards arranged perpendicularly to one another;

FIG. 7—A view of detail B of FIG. 6;

FIG. 8—A view of a contact arrangement for connecting the test pins of a test adapter with a test circuit;

FIG. 9—A view of the contact arrangement according to FIG. 8 in another operating position;

FIG. 10—A schematic view of a detail of FIGS. 8 and 9;

FIG. 11—A schematic view of another embodiment of an arrangement according to FIG. 10;

FIG. 12—A schematic view of a contact arrangement for connecting several circuit boards arranged parallel to one another;

FIGS. 13 and 14—Cross-sectional views each taken through a plug prong or a contact wire according to the previous figures;

FIG. 15—A contact arrangement with a guide plate arranged between two circuit boards provided with contact bores;

FIGS. 16A, B, C—Are generally similar vertical sectional views taken through the contact arrangement of FIG. 15 and respectively showing the components thereof in different operating positions.

Figure 17A:
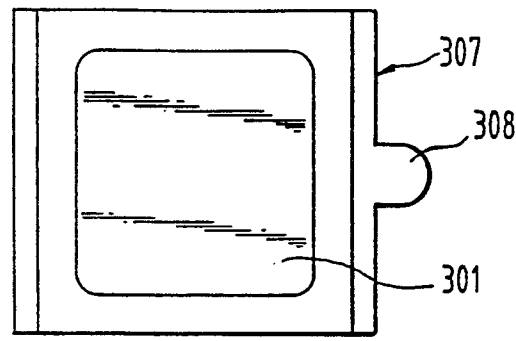
Figure 17B:
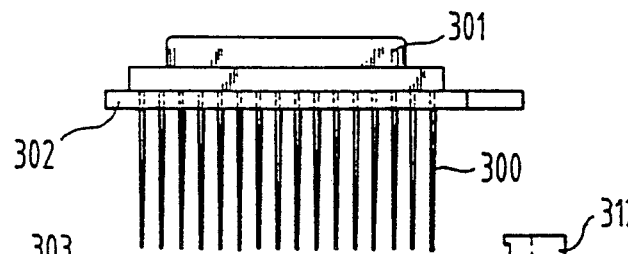
Figure 17C:
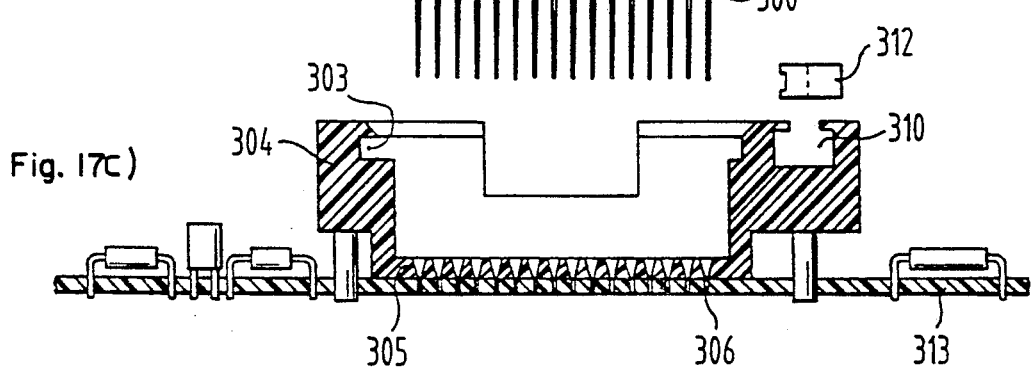
Figure 18:
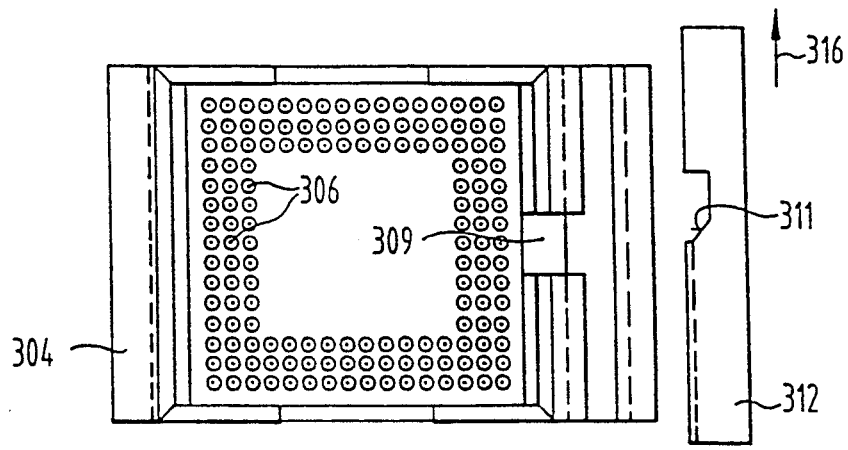

FIG. 17A—A top view of the first component of a contact arrangement embodying the invention;

FIG. 17B—A side view of the component of FIG. 17A;

FIG. 17C—A vertical sectional view of a housing for the component of FIG. 17A and of a second component forming part of the contact arrangement;

FIG. 18—A plan view of the contact arrangement of FIGS. 17A, 17B and 17C.

Figure 19:
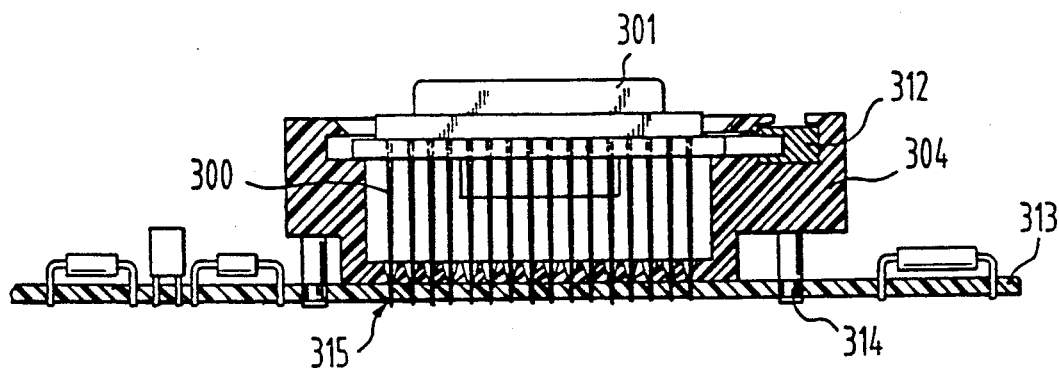
Figure 20:
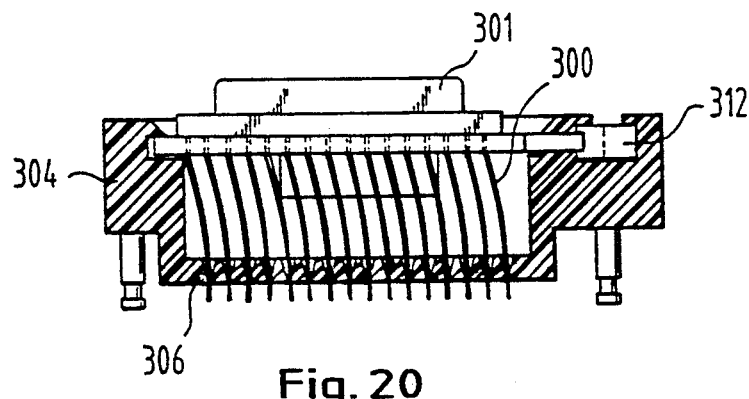
Figure 21:
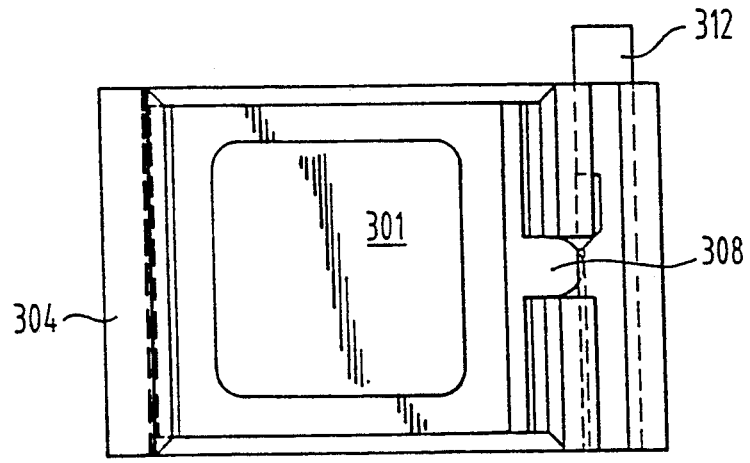
Figure 24:
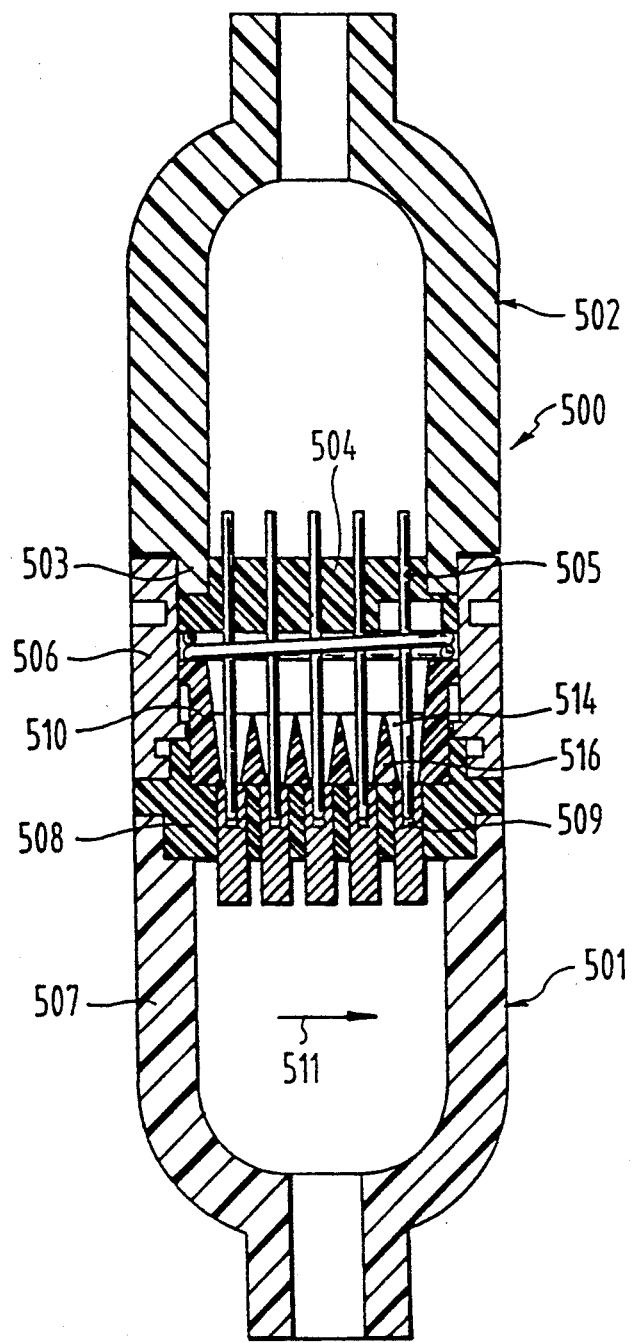
Figure 25:
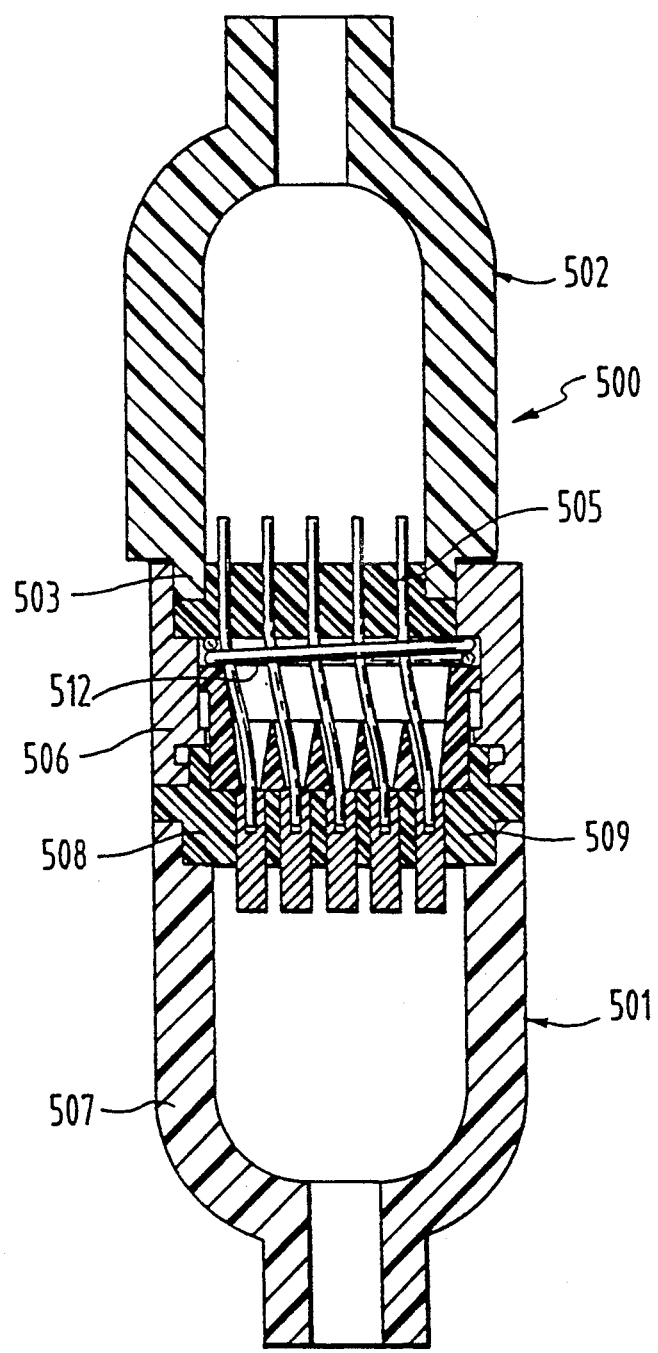

FIG. 19—A view of the contact arrangement of FIGS. 17A, 17B, 17C and 18 in the inserted position;

FIG. 20—A view of the contact arrangement of FIG. 19 in the contact position;

FIG. 21 A plan view of the contact arrangement of FIG. 20;

FIGS. 22 and 23—Views of an embodiment of the invention for contacting one circuit board with another;

FIGS. 24 and 25—Views of a round plug in an inserted position and a contact position, respectively.

FIG. 1 illustrates a flat cable plug 1 divided along a dividing line 2 and into which a flat cable 3 can be inserted in a known way. Upon assembly of the two parts of the flat cable plug 1 the plug prongs or bases 4 are brought into contact by self-cutting contact with the conductors of the flat cable 3.

The circuit board 5 is provided with contact bores 6 which serve to receive the contact prongs 4. The inner surfaces of the contact bores 6 are galvanically provided with conducting material (so-called plated through contacts) which are connected with non-illustrated conductor paths on the upper surface of the circuit board 5.

The flat cable plug 1 is provided with detent elements 8 which extend through and beyond detent bores 9 in the circuit board 5 and which engage the underside of the circuit board 5. As can be seen in FIG. 1 the detent elements 8 are somewhat mushroom-shaped. To assemble the flat cable plug 1 the heads of the mushroom-shaped detent elements are so arranged relative to the bores 9 that they can pass through the bores. In this position the plug prongs 4 are likewise positioned in alignment with the contact bores 6. The contact bores 6 have a free width which are larger than the external measurements of the plug prongs 4. The flat cable plug 1 can therefore be plugged with zero force into the circuit board 5. After this plugging in the flat cable plug 1 is shifted in the direction of the arrow 10 essentially transversely to the longitudinal direction of the plug prongs 4 with the result that the heads of the mushroom-shaped detent elements 8 engage the circuit board behind the detent bores 9 (see FIG. 1). In this position the plug prongs 4 are laterally deflected and are so tilted in the contact bores 6 that they come into contact with both the upper and lower inner edges of the contact bores 6.

To hold the flat cable plug 1 in the assembled position illustrated in FIG. 1, at least one of the feet 11 of the flat cable plug is provided on its lower side with a projection 12 which upon the shifting of the flat cable plug in the direction of the arrow 10 engages behind a projection 13 formed on the upper surface of the conductor plate 5, as can be seen from detail A of FIG. 1 illustrated in enlarged scale in FIG. 2.

FIG. 3 shows again a flat cable plug 15 with plug prongs 16 which insert into contact bores 17 in a circuit board 18. The flat cable plug 15 is connected in a way not illustrated in further detail with a component 19, for example a device wall. For the purpose of plugging the flat cable plug 15 into the contact bore 17 of the circuit board 18 the flat cable plug 15 is so positioned that the plug prongs 16 exactly align with the contact bores 17. After this plugging in the component 19 and the circuit board 18 are shifted perpendicular to the longitudinal direction of the contact plug 16 relative to one another with the result that the contact prongs 16 are laterally deflected and are thereby tilted in the contact bores 17 so that they are clamped between the upper and lower inner edges of the associated contact bores 17 to provide on one hand a good contact with the contact bores 17 and with the metallic inner surfaces covering these bores, and on the other hand a rigid mechanical hold in these plated through contacts is assured.

FIG. 4 shows an arrangement with two circuit boards 22,23 parallel to one another. On the circuit board 22 is an electrical component 25 provided with plug prongs 24, for example a memory module, assembled in a way similar to that described in connection with FIG. 1. The component 25 is first positioned relative to the circuit board 22 so that the plug prongs 24 align with the contact bores 26. After a force-free insertion the component 25 is shifted in the direction of the arrow 27 so that in the already described way the plug prongs 24 contact the contact bores 26. In a similar way an electrical component 28, for example a calculator module, is assembled on the circuit board 23 so that the plug prongs 29 of the component 28 contact the contact bores 30 of the circuit board 23.

To connect the circuit boards 22 and 23 with one another a further component 31 is arranged between the two circuit boards 22,23, which component 31 is in the form of a plate parallel to the circuit boards 22,23. This component carries contact prongs 32 which on one hand are received in contact bores 26a of the circuit board 22 and on the other hand are received in contact bores 30a of the circuit board 23. The component 31 is first so positioned that its plug prongs exactly align with the associated contact bores 26a and 30a. After the insertion of the plug prongs 32 in the associated contact bores the component 31 is shifted in the direction of the arrow 33 so that the plug prongs 32 are brought in the previously described way into secure contact with the associated contact bores 26a,30a.

FIG. 5 shows an arrangement similar to that of FIG. 4 with two circuit boards 34,35 each carrying an electric component 36 or 37 which is connected to the circuit board in the way described in connection with FIG. 4. To connect the two circuit boards 34,35 with one another a plate-shaped component 38 is again provided between the two circuit boards. This component 38 is provided with bores 41 arranged in the same pattern as the contact bores 39 of the circuit board 34 and the contact bores 40 of the circuit board 35. To connect the circuit boards 34,35 with one another the circuit boards and the component 38 are so positioned relative to one another that the contact bores 39,40 and the bores 41 align with one another. Then contact wires 42 are inserted through these aligned bores and the component 38 is shifted for example in the direction of the arrow 43 whereupon the contact wires 42 are deflected laterally and each is so tilted in its associated contact bores 39 and 40 that an electrical contact and a mechanical fixing are obtained in the already described way.

FIG. 6 shows a contact arrangement for connecting circuit boards standing perpendicularly to one another. The circuit board 45 serves for example as a so-called wiring rear wall, to which the circuit boards 46,47 stand perpendicularly. Connected with the circuit board 46 is a component 49 having plug prongs 48 connected to the circuit board 46 in the way already described in connection with FIG. 1 so that the plug prongs 48 are in contact with the contact bores 50 of the circuit board 46. The plug prongs 48 stand in connection with plug prongs 51 positioned generally perpendicularly to them and which plug prongs are received in contact bores 52 of the circuit board 45. The connection of the plug prongs 48 with the contact bores 50 of the circuit board 46 results from the shifting of the component 49 in the direction of the arrow 53, in the manner already described in connection with FIG. 1, as here not described again. The connection of the plug prongs 51 with the contact bores 52 results from the shifting of the circuit board 45 in the direction of the arrow 54. In a similar way the circuit board 47 is connected with the circuit board 45 through the component 55 having plug prongs 56 and 57.

FIG. 7 shows detail B of FIG. 6 in enlarged scale. It can be seen that the contact prong 56 as a result of its deflection perpendicularly to its longitudinal direction is so tilted in the contact bore 58 that it comes into intensive engagement with the upper inner edge 59 and a lower inner edge 60 of the metallically clad through plating 61 of the contact bore 58 so that on one hand an electrical contact is made and on the other hand a mechanical holding of the plug prong in the contact bore 58 is assured. As especially shown by FIG. 6 the through platings are respectively connected with conductor paths formed on the circuit board, as is known and is not in itself explained in detail.

FIG. 8 shows a contact arrangement which especially serves to connect the test pins 63 of a test adapter 64 with a non-illustrated test circuit. Test adapters for testing circuit boards generally have the following construction: in a fastening plate 65 are rigidly arranged test pins 63 in a predetermined pattern, with the test pins 63 having upwardly directed springy test noses 66. Above the fastening plate 65 is a support plate 67 onto which the circuit board to be tested is laid with the test points to be contacted facing downwardly. The support plate 67 with the circuit board arranged thereon can be pushed downwardly against the force of the springs 68 to cause the test points to engage the test noses 66.

The lower ends of the test pins 63 carry plug prongs or contact wires 69 which in the present exemplary embodiment pass through aligned contact bores 70,71,72 of circuit boards 73,74,75 arranged parallel to one another. The middle circuit board 74 is supported in the test adapter 64 for movement in the direction of the double arrow 76. For connecting the circuit boards 73,74,75 with one another the contact wires 69 are inserted through the associated contact bores 70,71,72 of the circuit boards 73,74,75. Since the free widths of the contact bores are larger than the external measurements of the contact wires 69 this insertion takes place with zero force. After the insertion of the contact wires 69 the circuit board 74 is shifted toward the left as shown in FIG. 9 with respect to the circuit boards 73 and 75, whereby the contact wires 69 are laterally deflected. Thereby they are so tilted in the associated contact bores 70,71,72 that a good electrical contact with the contact bores results in the already described way.

By an increase in the number of circuit boards the number of connections of the individual test pins 63 can be increased as far as desired.

The shifting of the middle circuit board 74 results for example through an eccentric cam 78 rotatable about an axis 77 extending perpendicular to the plane of the circuit board, which cam is received in an elongated opening 79 in the circuit board 74 extending perpendicularly to the shift direction 76. The adjustment of the eccentric cam 78 is accomplished for example manually by means of a hand knob 80 connected with the shaft 81 carrying the eccentric cam 78.

The contact bores 70,71,72 are connected with conductor paths 82,83,84 on the associated circuit boards 73,74,75, which circuit paths lead to a plug connector 75 arranged on the edge of the circuit board, through which a connection to the test circuit is possible.

FIG. 10 shows schematically the middle circuit board 74 of FIGS. 8 and 9. The eccentric cam 78 is adjustable along a circular path 86 and moves the circuit board 74 in the direction of the double arrow 76. By means of elongated holes 87 positioned parallel to the double arrow 76, and through which vertical connecting struts of the test adapter 64 pass (see also FIG. 8) the circuit board is guided for exact parallel movement.

FIG. 11 shows an embodiment of the invention in which a circuit board 74a is adjustable along a circular path lying in its plane. Two circularly shaped eccentric cams 89,90 are each adjustable in synchronism along circular paths 91,92. They therefore move the circuit board 74a so that it is moved in accordance with the double arrow 93. The connecting struts 88a extend through circular guide openings 87a in the circuit board 74a and carry the circuit board 74a for exact guidance.

FIG. 12 shows a contact arrangement in which three circuit boards 95,96,97 are arranged parallel to one another and are to be connected with one another. They are provided with with aligned contact bores 98,99,100 through which a contact wire 101 is insertable, which wire during the insertion step is exactly straight. The contact bores 98,99,100 have free widths which are larger than the external measurements of the contact wire 101 so that this insertion takes place with zero force. Between the circuit boards 95 and 96 on one hand as well as between the circuit boards 96 and 97 on the other hand are devices 102,103 for laterally deflecting the contact wire 101. The devices 102,103 have the form of flat plates provided with through bores 104 and 105 which are distributed in a pattern corresponding to the pattern of the contact bores of the circuit boards 95,96,97. For connecting the circuit boards with one another the device 102 is moved in the direction of the arrow 106 and the device 103 is moved in the direction of the arrow 107 whereby the contact wire 101 is laterally deflected into the position of FIG. 12 and is so tilted in the associated contact bores 98,99,100 that an electrical contact is created in the previously described way. The contact wires 101 are fastened in the illustrated embodiment to a holder plate 108 in which their ends are inserted into blind bores 108 and soldered in place. The holding plate 108 can itself be formed as a circuit board as indicated by a circuit path 110 formed on it.

The connection of several circuit boards 95,96,97 arranged parallel to one another in accordance with the embodiment illustrated in FIG. 12 can take the place of the usual arrangement in which the circuit boards are plugged into a common wiring rear wall. In this customary arrangement relatively long connecting paths exist between components which are arranged on the different circuit boards since the conductor paths are directed to plug connections arranged on the edges of the circuit boards and pass through the common wiring rear wall. In contrast to this in the arrangement of FIG. 12 a much more direct and shorter connection is possible between the elements on the different circuit boards.

FIG. 13 and FIG. 14 each show a cross-section through a plug prong or a contact wire, for example the contact wire 101 of FIG. 12. To improve the contact with the associated contact bore or with the bushing lining the bore, the contact wire in each case has a multi-cornered cross-section with sharp cutting edges 111 or 112 running longitudinally along outer lines. The contact wires are made preferably of spring steel and are gold plated.

FIG. 15 shows an arrangement somewhat according to FIG. 5 in which a circuit board 200 to be tested is for example to be brought into contact with a first contact plate 102 and a second contact plate 202. The circuit board to be tested has plugged into it electronic components 203. The circuit board 200 to be tested has contact bores 204, the first contact plate has contact bores 205 and the second contact plate 202 has contact bores 206, the contact bores of which plates can be positioned so as to be aligned with the contact bores of the other plates. In these contact bores 204, 205 and 206 are inserted contact wires 207. To facilitate this insertion of the contact wires 207, a guide plate 208 is for example arranged between the circuit board 200 and the first contact plate 202, which guide plate 208 is provided with guide bores 209 arranged in the pattern of the contact bores of the circuit board 200 or of the first circuit board 201. It can be seen that the contact bores 209 are formed toward their bottoms as funnel-shaped capturing bores to ease the insertion of the contact wires 207 during the inserting process. The guide plate 208 is movable backwards and forwardly in the direction of the arrow 210 and is arrestable in at least its lower and upper positions.

FIG. 16 shows an insertion process for the purpose of testing a circuit board 200. In FIG. 16a the guide plate 208 is shown in its upper position. The funnel-shaped guide bores 209 permit an insertion of the contact wires even if the wires are slightly displaced. The circuit board 200 is set on the guide plate 208 and is positioned exactly on it by centering elements arranged on one hand on the guide plate and on the other hand on the circuit board, so that the contact bores 204 of the circuit board 200 align exactly with the guide bores 209 of the guide plate 208 (see FIG. 16b). Then the guide plate 208 is lowered so that the circuit board 200 likewise can be adjusted to a somewhat lowered test position in which the contact wires 207 can pass entirely through the contact bores 204. Then by opposite sided transverse adjustment of the contact plate 201 relative to the circuit board 200 in the previously described way a contact is made, with the guide bores 209 of the entirely lowered guide plate 208 not hindering the inclined positioning of the contact wires 207 especially relative to the circuit board 200.

FIG. 17 shows an electronic component 301 provided with plug prongs 300 The component 301 is provided with a rectangular flange 302 which is receivable in a receiving groove 303 of a receiving housing 304 associated with the component 301. The receiving housing 304 has a bottom plate 305, which constitutes a guide plate for the prongs 300 by being provided with through bores 306 of upwardly widening funnel shape for the passage of the plug prongs 300.

A cam 308 is formed on a side edge 307 of the rectangular flange 302 of the component 301, as especially shown in the plan view of FIG. 17a of the component 301. The cam 308 upon the insertion of the component 301 in a recess 309 in the side edge of the receiving housing 304 associated with the side edge 307 extends to a channel 310 running parallel to the side edge 307, in which channel a push bar 312 having a cam face 311 is slidably arranged (see also FIG. 18). For the assembly of the component 301 the receiving housing 304 is first set onto a circuit board 313 and by means of centering pins 314 is positioned on the circuit board 313 and fastened. Then the component 301 is inserted from above into the receiving housing 304 with the plug prongs 300 being inserted through the capturing funnel forming through openings 306 into the contact bores 315 of the circuit board 313. In this insertion essentially no insertion force is required since the plug prongs 300 fit into the contact bores 315 with free play. Also each funnel-shaped opening or bore 306 has a minimum diameter or cross-section zone of very small vertical extent, obtained in the illustrated case of FIG. 17 by having the minimum diameters of all of the openings 306 contained in the plane of the bottom face of the bottom plate 305. Therefore, when a prong is inserted vertically into and through an opening 306 and its upper portion is then tilted away from the vertical the bottom portion of the prong will be free to also tilt away from the vertical by pivoting about the minimum diameter zone of the opening. In the position illustrated in FIG. 19 the cam by the cam 308 lies in the recess of the push bar 312 defined face 311. When the push bar 312 is pushed in the direction of the arrow 316 (see FIG. 18) the component 301 is pushed toward the left in the way illustrated in FIG. 20 with the result that the plug prongs 300 are bent away from vertical and their lower ends, which protrude downwardly from the bottom face of the bottom plate 305, are tilted in the contact bores 315 of the circuit board 313 to provide contacts. The length of the plug prongs 300 is for example ten times as large as the depth of the contact bores 315 so that the force applied to the upper areas of the plug prongs 300 as a result of lever effect is amplified to a ten times larger contact force in the area of the contact bores.

FIG. 21 shows the arrangement of FIG. 19 in plan view.

FIGS. 22 and 23 show an embodiment for connecting a first circuit board 400 with a second circuit board 401 standing perpendicularly to it. In this case a contact arrangement 402 is used consisting of a component 404 provided with plug prongs 403 and a receiving housing 405. The component 404, which is connected in a suitable way to the circuit board 400 and to the circuit elements arranged on it, is inserted for connection into the component 405 connected with the circuit board 401, with the plug prongs 403 being inserted through the funnel-shaped through openings 407, which capture the prongs, and into the contact bores 408 of the circuit board 401. The component 404 is for example shiftable by hand relative to the receiving housing 405 in the direction of the arrow 409 and can be held in place by a catch element 410. An actuating tab 411 serves to release the catch element 410.

As shown especially in FIG. 23 the plug prongs 403 are deflected and brought into contact with the contact bores 408 of the circuit board 401 with a force amplification being achieved by the large length of the plug prongs 403 in comparison to the depth of the contact bores 408, as described already in connection with the previous embodiment.

It is to be mentioned that the upper component 404 also can for example be formed as a housing for receiving a flat cable so that a construction corresponding to the construction of FIGS. 22 and 23 can also be used with circuit boards for connection to flat cables.

FIGS. 24 and 25 show a round plug arrangement with a plug 500 and a receptacle 501. The plug housing 502 has at its lower end an axially circular flange 503 inside of which an insert 504 for holding the plug prongs 505 is placed. An adjusting ring is rotatably supported on the axially extending ring flange 503 the inside contour of which is supported on the ring flange and which adjusting ring in its upper region has an eccentric inner contour. Moreover an axially shiftable supplementary piece 510 is arranged in the plug housing and is urged axially outwardly by a compression spring 512, is corresponding and which corresponds somewhat to the receiving housing of the previous embodiment and having a base 516 provided with funnel-shaped capturing bores 514.

The receptacle 507 carries at its forward end an insert 508 having contact bores 509 for receiving the plug prongs 505. Upon coupling of the plug 500 with the receptacle 501 the piece 510 is urged into the piece 508 and is pressed inwardly against the force of the spring 512 so that the plug prongs 505 enter the contact bores 509. By rotation of the adjusting ring 506 relative to the plug housing 502, which is held against rotation, and to the receptacle housing 507 the entire receptacle 501 is shifted laterally in the direction of the arrow 511 relative to the plug 500 so that the plug prongs 505 are bent and are tilted in the contact bores 509 and therefore make contact with them. The relationship of the length of the plug prongs 505 to the insertion depth of the plug prongs 505 in the contact bores 509 determines again the amplification of the applied adjusting force into a contact force substantially increased with respect to the adjusting force.

We claim:

1. A contact arrangement for electrically connecting the plug prongs of a first electrical component with contact bores formed in a second electrical component, wherein said contact bores have cross sections which are larger than those of said plug pronge to permit said plug prongs to be inserted into said contact bores with little or not force, and wherein said contact prongs are shifted perpendicularly to their longitudinal direction and tilted in the associated ones of said contact bores to provide contacts, characterized in that a receiving housing is associated with said first component and has a bottom plate onto which said second component with contact bores is placable, which bottom plate serves as a guide plate located in front of said second component in the insertion direction and is arrangement perpendicularly to the insertion direction of said plug prongs and is provided with guide holes for said plug prongs arranged in a pattern corresponding to the pattern of the corresponding contact bores and aligned therewith and having cross sections larger than those of said contact bores, and in that said first component is movable perpendicularly to the direction of said plug prongs with respect to said receiving housing from an insertion position at which said plug prongs align with said guide openings of said guide plate to a contact position and is arrestable in said contact position.

2. A contact arrangement according to claim 1 further characterized in that the guide holes are funnel shaped so that they become narrowed as they proceed from the opening width in the insertion direction.

3. A contact arrangement according to claim 1 further characterized in that said receiving housing is provided with means for exactly positioning and fastening it relative to said second component.

4. A contact arrangement according to claim 1 further characterized in that actuating means are provided for transversely shifting said first component relative to said receiving housing.

5. A contact arrangement according to claim 1 further characterized by means for latching said first component to said receiving housing in the contact position.

6. A contact arrangement according to claim 5 further characterized in that said actuating means includes a push bar shiftably supported in said receiving housing and having a cam actuating face, which push bar cooperates with a cam arranged on said first component.

7. A contact arrangement according to claim 5 further characterized in that said cam actuating face forms a ramp running inclined to the shift direction of said push bar and which transitions into a latching surface running parallel to the shift direction of said push bar.

8. A contact arrangement according to claim 5 further characterized in that said means for latching said first component with respect to said receiving housing is formed by a spring catch element on said receiving housing and a catch recess formed in said first component.

9. A contact arrangement according to claim 1 further characterized in that the free length of said plug prongs is a multiple of the depth of said contact bores in the insertion direction.

10. A contact arrangement for electrically connecting the plug prongs of a first electrical component with contact bores formed in a second electrical component, wherein said contact bores have cross sections which are larger than those of said plug prongs to permit said plug prongs to be inserted into said contact bores with little or no force, and wherein said contact prongs are shifted perpendicularly to their longitudinal directions and tilted int he associated ones of said contact bores to provide contacts, characterized in that a guide plate is provided in front of the second component in the insertion direction having guide openings arranged in a pattern corresponding to the pattern of the corresponding contact bores and aligned therewith and having opening cross sections greater than those of said contact bores, and in that means are provided for shifting the first component and the second component in a given direction perpendicular to the longitudinal direction of the plug prongs as well as for holding the components in a shifted contact position, each of said guide openings being funnel-shaped so as to become of smaller cross section as it proceeds away from its opening cross section in the insertion direction and having a minimum cross section zone of very small extent in the insertion direction so that when one of said prongs is inserted through said opening the portion of said prong which extends beyond said minimum cross section zone in the insertion direction can freely tilt relative to said guide plate by pivoting about said zone of minimum cross section as said first and second components are shifted relative to one another in said given direction.

11. A contact arrangement according to claim 10 further characterized in that said guide plate has a bottom face facing in said direction of insertion, and said minimum cross section zones of said openings are located in the plane of said bottom face.

12. A contact arrangement according to claim 10 further characterized in that a receiving housing is associated with the first component having plug prongs, which receiving housing is provided with a bottom plate serving as said guide plate containing said guide openings and onto which bottom plate the second component with contact bores is placable, and in that the first component is movable perpendicularly to the direction of the plug prongs with respect to the receiving housing from an insertion position at which the plug prongs align with the guide openings of the guide plate to a contact position and is arrestable in the contact position.

* * * * *